United States Patent
Nendai

(10) Patent No.: US 9,881,899 B2
(45) Date of Patent: Jan. 30, 2018

(54) ORGANIC LIGHT-EMITTING DEVICE AND ORGANIC DISPLAY DEVICE

(71) Applicant: JOLED INC., Tokyo (JP)

(72) Inventor: Kenichi Nendai, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/324,682

(22) PCT Filed: Jul. 7, 2015

(86) PCT No.: PCT/JP2015/003411
§ 371 (c)(1),
(2) Date: Jan. 6, 2017

(87) PCT Pub. No.: WO2016/006230
PCT Pub. Date: Jan. 14, 2016

(65) Prior Publication Data
US 2017/0194287 A1 Jul. 6, 2017

(30) Foreign Application Priority Data

Jul. 9, 2014 (JP) .................................. 2014-141293

(51) Int. Cl.
*H01L 51/52* (2006.01)
*H01L 25/04* (2014.01)

(52) U.S. Cl.
CPC ........ *H01L 25/048* (2013.01); *H01L 51/5253* (2013.01)

(58) Field of Classification Search
CPC .......................... H01L 51/5253; H01L 25/048
See application file for complete search history.

(56) References Cited

U.S. PATENT DOCUMENTS

| 5,443,922 A | 8/1995 | Nishizaki et al. |
| 2013/0214301 A1 | 8/2013 | Yamada et al. |

FOREIGN PATENT DOCUMENTS

| JP | 5-163488 A | 6/1993 |
| JP | 2002-75640 | 3/2002 |
| JP | 2002-75670 | 3/2002 |

(Continued)

OTHER PUBLICATIONS

International Search Report in International Application No. PCT/JP2015/003411, dated Oct. 13, 2015.

*Primary Examiner* — Douglas Menz
(74) *Attorney, Agent, or Firm* — Hauptman Ham, LLP

(57) ABSTRACT

An organic light-emitting device having light-emitting portions arranged in two directions along a substrate main surface. Each light-emitting portion, in a first direction intersecting the substrate main surface, includes, disposed via a first insulating layer, a first electrode, an organic laminate, and a second electrode. In a second direction being one of the two directions along the substrate main surface, a non-light-emitting portion is present between adjacent light-emitting portions. The first electrodes of the adjacent light-emitting portions extend into the non-light-emitting portion. A second insulating layer is present between portions of the first electrodes in the non-light-emitting portion, and covers the portions of the first electrodes in the non-light-emitting portion. A height of the second insulating layer from the substrate main surface is lower than a height, from the substrate main surface, of upper surfaces of portions of the first electrodes in the light-emitting portions.

10 Claims, 12 Drawing Sheets

(56) References Cited

FOREIGN PATENT DOCUMENTS

| JP | 2012-164574 A | 8/2012 |
|----|---------------|--------|
| JP | 2013-89444 A  | 5/2013 |
| JP | 2013-191533 A | 9/2013 |
| JP | 2014-22349 A  | 2/2014 |

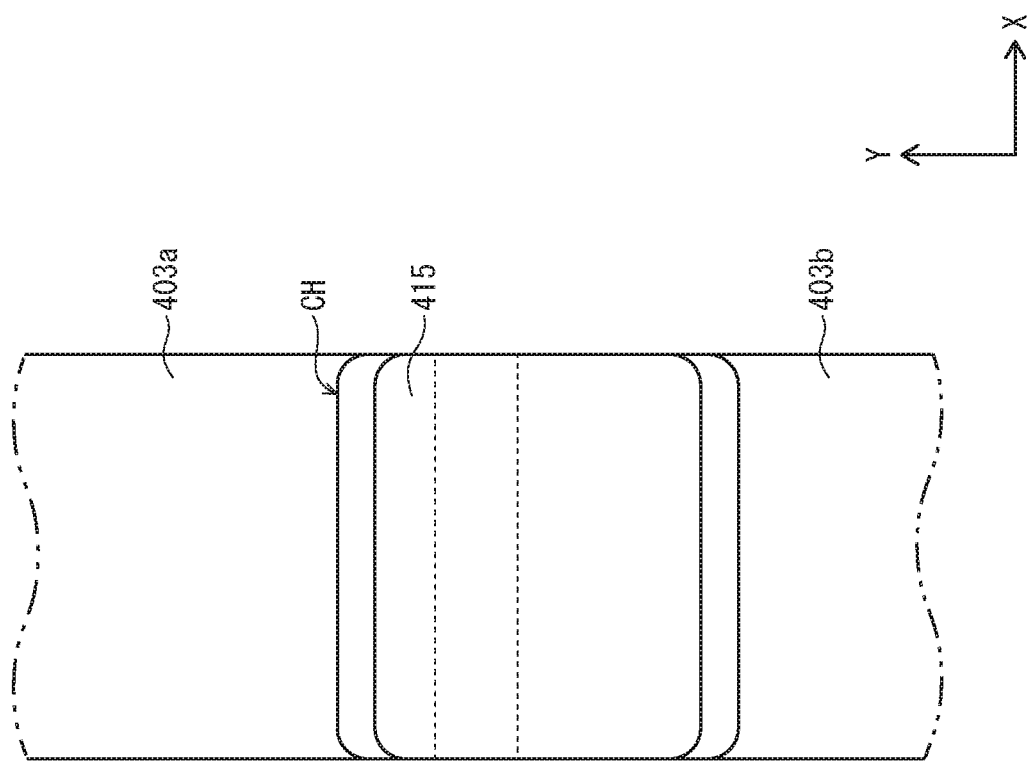

ORGANIC LIGHT-EMITTING DEVICE AND ORGANIC DISPLAY DEVICE

RELATED APPLICATIONS

The present application is a National Phase of International Application Number PCT/JP2015/003411, filed on Jul. 7, 2015, which claims priority to Japanese Patent Application Number 2014-141293, filed on Jul. 9, 2014.

TECHNICAL FIELD

The present invention relates to organic light-emitting devices and organic display devices. In particular, the present invention relates to a structure of banks defining a light-emitting portion.

BACKGROUND ART

In recent years, much development is being conducted of organic light-emitting devices, such as organic electroluminescence (EL) panels and organic EL lighting devices (Patent Literature 1). The following describes a structure of a conventional organic EL panel, with reference to FIG. 12A.

The conventional organic EL panel illustrated in FIG. 12A has a substrate 900, a thin film transistor (TFT) layer 901 disposed on one main surface (one of the main surfaces located higher in the Z-axis direction) of the substrate 900, and an insulating layer 902 disposed on the TFT layer 901. The conventional organic EL panel further includes anodes 903 and hole injection layers 904 disposed in this order on the insulating layer 902. Note that a combination of one anode 903 and one hole injection layer 904 is provided for every sub-pixel (light-emitting portion) of the panel.

The conventional organic EL panel further includes second banks 915 that extend in the X-axis direction. Each second bank 915 is disposed on the insulating layer 902, at a gap area including Y-axis direction edges of two anodes 903 and Y-axis direction edges of two hole injection layers 904. The conventional organic EL panel further includes first banks 905 that extend in the Y-axis direction to intersect with the second banks 915.

The conventional organic EL panel further includes, disposed at each area between an adjacent pair of first banks 905, a plurality of organic films. Specifically, the organic films include a hole transport layer 906, an organic light-emitting layer 907, and an electron transport layer 908 disposed in this order. The conventional organic EL panel further includes a cathode 909 and a sealing layer 910 that are disposed in this order to cover the electron transport layer 908 over each area between an adjacent pair of first banks 905 and exposed surfaces of the first banks 905.

Note that while not illustrated in FIG. 12A, the conventional organic EL panel further includes a color filter panel unit that is disposed on the Z-axis direction upper side of the structure illustrated in FIG. 12A via a resin layer.

CITATION LIST

Patent Literature

[Patent Literature 1]
Japanese Patent Application Publication No.: 2002-75670

SUMMARY OF INVENTION

Technical Problem

Meanwhile, the present inventor, in cooperation with one or more others, has found that an organic film, such as a hole transport layer 906 or an organic light-emitting layer 907, may not be formed properly in the conventional organic light-emitting device with the above-described structure. Specifically, the hole transport layer 906 may not be formed properly over an area of an upper surface 915$a$ of a second bank 915 that is indicated by arrow G in FIG. 12B.

When an organic film is formed improperly over a second bank 915, there is a risk of the organic film not having a desired thickness in light-emitting portions at both sides of the second bank 915. This may result in low light-emission performance.

The present invention has been made to overcome the technical problem(s) described above, and aims to provide an organic light-emitting device and an organic display device that have high luminous efficacy for the risk being suppressed of an organic film being formed improperly at a gap area between adjacent light-emitting portions.

Solution to Problem

One aspect of the present invention is an organic light-emitting device including: a substrate; a first insulating layer on or above the substrate; and light-emitting portions disposed on or above the first insulating layer in a two-dimensional arrangement in two directions along a main surface of the substrate. The light-emitting portions, in a first direction intersecting the substrate main surface, each include: a first electrode; an organic laminate; and a second electrode.

The first electrode is on or above the first insulating layer.

The organic laminate is above the first electrode, and at least includes an organic light-emitting layer.

The second electrode is above the organic light-emitting layer.

The organic light-emitting device pertaining to one aspect of the present invention includes a non-light-emitting portion between adjacent ones of the light-emitting portions in a second direction that is one of the two directions along the main surface of the substrate. The non-light-emitting portion includes: extension portions of the first electrodes of the adjacent light-emitting portions that extend into the non-light-emitting portion; and a second insulating layer present between ends of the extension portions and over the extension portions.

In the organic light-emitting device pertaining to one aspect of the present invention, a height, from the substrate main surface, of an upper surface of the second insulating layer being lower than a height, from the substrate main surface, of upper surfaces of portions of the first electrodes in the light-emitting portions.

Advantageous Effects of Invention

In the organic light-emitting device pertaining to one aspect of the present invention, upper ends of the second insulating layer are located lower than the upper surfaces of the portions of the first electrodes in the light-emitting portions. This reduces the risk of the organic laminate, which is disposed through application on the second insulating layer, not being formed properly.

Accordingly, in the organic light-emitting device, the risk is low of an organic film (one or more organic films included in the organic laminate) not being formed properly at a gap area (non-light-emitting portion) between adjacent light-emitting portions. Thus, the organic light-emitting device pertaining to one aspect of the present invention has high luminous efficacy.

BRIEF DESCRIPTION OF DRAWINGS

FIG. 11 is a schematic plan view diagram illustrating anodes 403a, 403b, and an inter-electrode insulating layer 415 in the structure of a display panel pertaining to embodiment 3 of the present invention.

DESCRIPTION OF EMBODIMENTS

[Matters Considered by Present Inventor and Others]

The present inventor, in the process of conceiving various aspects of the present invention, considered the following matters.

Figure 12A:
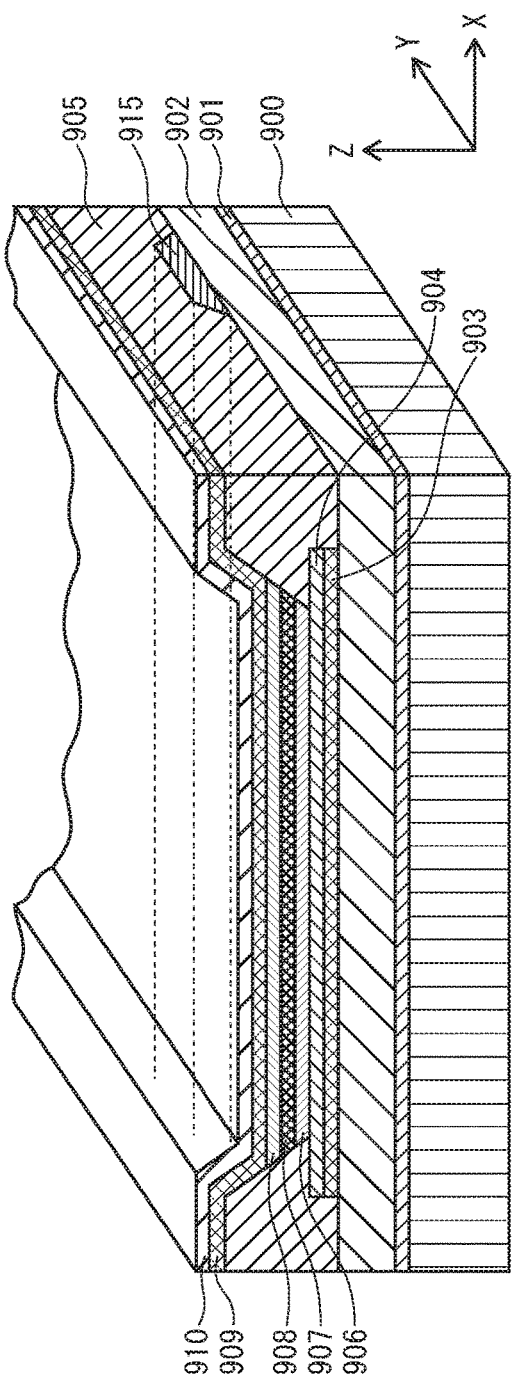
FIG. 12A is a perspective diagram (a cross-sectional diagram) illustrating a part of the structure of a display panel pertaining to conventional technology.
Figure 12B:
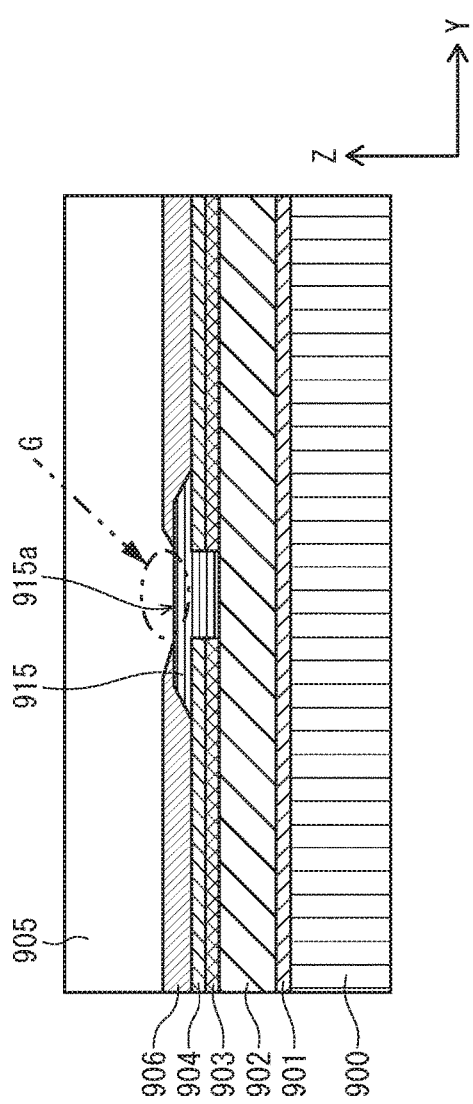
FIG. 12B is a cross-sectional diagram illustrating one example of a hole transport layer 906 not having been formed properly.

In the conventional display panel illustrated in FIGS. 12A and 12B, the upper surface 915a of the second bank 915 is located higher in the Z-axis direction than upper surfaces of the anodes 903 and the hole injection layers 904. Accordingly, there is a risk of a surface portion of the second bank 915, which has liquid repellency, not being sufficiently covered with an ink for the hole transport layer 906, which is an organic film, upon application of the ink (i.e., there is a risk of insufficient wetting with ink occurring at a surface portion of the second bank 915).

Note that while provision of the hole transport layer 906 with greater thickness may be considered for preventing such insufficient wetting with ink from occurring at the upper surface 915a of the second bank 915, this increase of thickness is not a preferable measure to be taken in a light-emitting device. This is since such increase of thickness may results in problems such as an increase in electrical resistance and difficulty in optical design.

[Overview of Aspects of Present Invention]

One aspect of the present invention is an organic light-emitting device including: a substrate; a first insulating layer on or above the substrate; and light-emitting portions disposed on or above the first insulating layer in a two-dimensional arrangement in two directions along a main surface of the substrate. The light-emitting portions, in a first direction intersecting the substrate main surface (substrate thickness direction), each include: a first electrode; an organic laminate; and a second electrode.

The first electrode is on or above the first insulating layer.

The organic laminate is above the first electrode, and at least includes an organic light-emitting layer.

The second electrode is above the organic light-emitting layer

The organic light-emitting device pertaining to one aspect of the present invention includes a non-light-emitting portion between adjacent ones of the light-emitting portions in a second direction that is one of the two directions along the main surface of the substrate. The non-light-emitting portion includes: extension portions of the first electrodes of the adjacent light-emitting portions that extend into the non-light-emitting portion; and a second insulating layer present between ends of the extension portions and over the extension portions.

In the organic light-emitting device pertaining to one aspect of the present invention, a height, from the substrate main surface, of an upper surface of the second insulating layer being lower than a height, from the substrate main surface, of upper surfaces of portions of the first electrodes in the light-emitting portions.

In the organic light-emitting device pertaining to one aspect of the present invention, upper ends of the second insulating layer are located lower than the upper surfaces of the portions of the first electrodes in the light-emitting portions. This reduces the risk of the organic laminate to be disposed through application on the second insulating layer being formed improperly on the second insulating layer.

Further, since the second insulating layer is present at the gap between two adjacent first electrodes, there is no risk of a leak current occurring between these electrodes.

Accordingly, in the organic light-emitting device, the risk is low of an organic film (one or more organic films included in the organic laminate) being formed improperly at a gap area (non-light-emitting portion) between adjacent light-emitting portions. Thus, the organic light-emitting device pertaining to one aspect of the present invention has high luminous efficacy.

Another aspect of the present invention is the organic light-emitting device pertaining to one aspect of the present invention wherein the height, from the substrate main surface, of the upper surfaces of the portions of the first electrodes in the light-emitting portions is higher than the height of upper surfaces of the extension portions from the substrate main surface, and in each of the first electrodes, a step portion is formed at a boundary between the extension portion and the portion in the light-emitting portion, an upper corner of the step portion having the shape of an outward convex curve and not being covered by the second insulating layer.

Providing the upper corner of the first electrode, which is not covered by the second insulating layer, with a curved shape reduces the risk of a break being formed above the upper corner in an organic film (component of the organic laminate) disposed above the first electrode, and thus reduces the risk of short-circuiting at the upper corner.

In addition, providing the upper corner of the first electrode with a curved shape also efficiently prevents the occurrence of a so-called edge emission, without covering the upper corner with the second insulating layer. Thus, this structure suppresses a decrease in device lifetime.

Another aspect of the present invention is the organic light-emitting device pertaining to one aspect of the present invention wherein the light-emitting portions each further include a charge injection layer disposed between the first electrode and the organic laminate, and the charge injection layer has a portion covering the upper corner of the first electrode, the portion of the charge injection layer having the shape of an outward convex curve and not being covered by the second insulating layer. Note that the charge injection layer is a hole injection layer or an electron injection layer, and which one of the hole injection layer and the electron injection layer is the charge injection layer is dependent upon the polarity of the first electrode.

Providing a portion of the charge injection layer covering the upper corner also with a curved shape reduces the risk of a break being formed above the portion in an organic film (component of the organic laminate) disposed above the charge injection layer, and thus reduces the risk of short-circuiting at the upper corner.

In addition, providing a portion of the charge injection layer covering the upper corner also with a curved shape also efficiently prevents the occurrence of a so-called edge emission above the upper corner. Thus, this structure suppresses a decrease in device lifetime.

Another aspect of the present invention is the organic light-emitting device pertaining to one aspect of the present invention wherein a height of an upper surface of the first insulating layer from the main surface of the substrate is higher below the light-emitting portions than below a gap between the ends of the extension portions in the non-light-emitting portion, and the first electrodes are disposed along the upper surface of the first insulating layer.

Providing the upper surface of the first insulating layer with level differences and disposing the first electrodes along the upper surface of the first insulating layer facilitates providing each first electrode with a shape such that an upper surface of a portion of the first electrode in a non-light-emitting portion is lower (i.e., closer to the substrate) than an upper surface of a portion of the first electrode in a light-emitting portion. Providing each first electrode with such level difference guarantees that the upper surface of the second insulating layer is lower (i.e., closer to the substrate) than an upper surface of a portion of a first electrode in a light-emitting portion.

Another aspect of the present invention is the organic light-emitting device pertaining to one aspect of the present invention further including a thin film transistor (TFT) layer between the substrate and the first insulating layer, the TFT layer including a plurality of transistor element portions, wherein the transistor element portions are disposed at areas of the TFT layer below the light-emitting portions.

Disposing transistor element portions of the TFT layer below the light-emitting portions (i.e., at areas of the TFT layer above which the upper surface of the first insulating layer is relatively high) guarantees a sufficient distance between the upper surface of TFT layer and the upper surface of the first insulating layer. This structure effectively suppresses the occurrence of electric leakage between components such as the TFT layer and a first electrode.

Another aspect of the present invention is the organic light-emitting device pertaining to one aspect of the present invention wherein the first insulating layer has, for each of the first electrodes, a contact hole electrically connecting the first electrode with a corresponding one of the transistor element portions, the contact hole disposed at an area of the first insulating layer corresponding to the non-light-emitting portion. Disposing a contact hole for a first electrode at an area of the first insulating layer above which the first electrode is covered by the second insulating layer reduces the surface area of the device occupied by non-light-emitting portions. Thus, this structure is effective for achieving high luminous efficacy.

Another aspect of the present invention is the organic light-emitting device pertaining to one aspect of the present invention wherein in the first insulating layer, a lateral surface defining the contact hole is inclined relative to the substrate main surface and has a tapered shape, and the gap between the ends of the extension portions in the non-light-emitting unit is located on the lateral surface of the first insulating layer. Arranging the gap between ends of first electrodes on a lateral surface of the first insulating layer defining a contact hole reduces the surface area occupied by non-light-emitting portions. Thus, this structure is advantageous for achieving high definition.

Another aspect of the present invention is the organic light-emitting device pertaining to one aspect of the present invention wherein a difference between the height, from the substrate main surface, of the upper surface of the first insulating layer below the light-emitting portions and the height, from the substrate main surface, of the upper surface of the first insulating layer below the gap between the ends of the extension portions in the non-light-emitting portion is equal to or greater than a thickness of portions of the second insulating layer over the extension portions.

This structure ensures that the upper surface of the second insulating layer is lower (i.e., closer to the substrate) than an upper surface of a portion of a first electrode in a light-emitting portion.

Another aspect of the present invention is the organic light-emitting device pertaining to one aspect of the present invention further including a non-light-emitting portion between adjacent ones of the light-emitting portions in a third direction that is the other one of the two directions along the main surface of the substrate, in the third direction, the non-light-emitting portion including banks each extending in the second direction, wherein adjacent ones of the organic laminates in the third direction are partitioned from one another by the banks.

Adopting the so-called line bank structure ensures that a flat area with a great surface area is present at an upper surface receiving ink application upon forming of an organic film, and also facilitates providing light-emitting portions with similar thicknesses. Thus, this structure is advantageous for high light-emission performance.

Another aspect of the present invention is an organic display device including: a display panel; and a drive and control circuit that is connected to the display panel, wherein the display panel has the device structure of the organic light-emitting device pertaining to one of the above-described aspects. This structure achieves high light-emission performance (display performance) for the reasons discussed above.

Embodiment 1

The following describes the structure of an organic EL display device 1 pertaining to embodiment 1, with reference to the accompanying drawings.

1. Overall Structure

Figure 1:
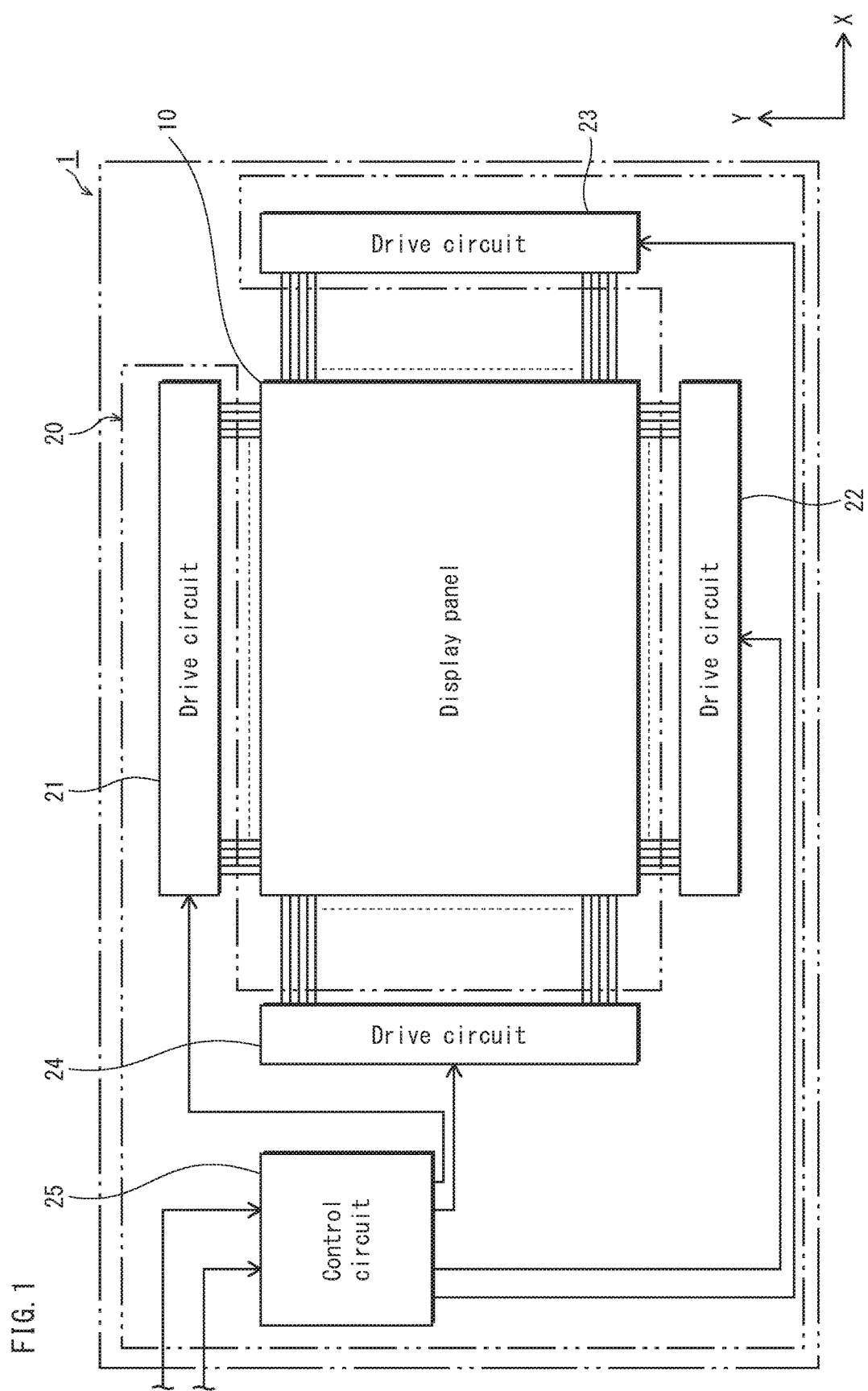
FIG. 1 is a schematic block diagram illustrating the overall structure of an organic EL display device 1 pertaining to embodiment 1 of the present invention.
Figure 2:
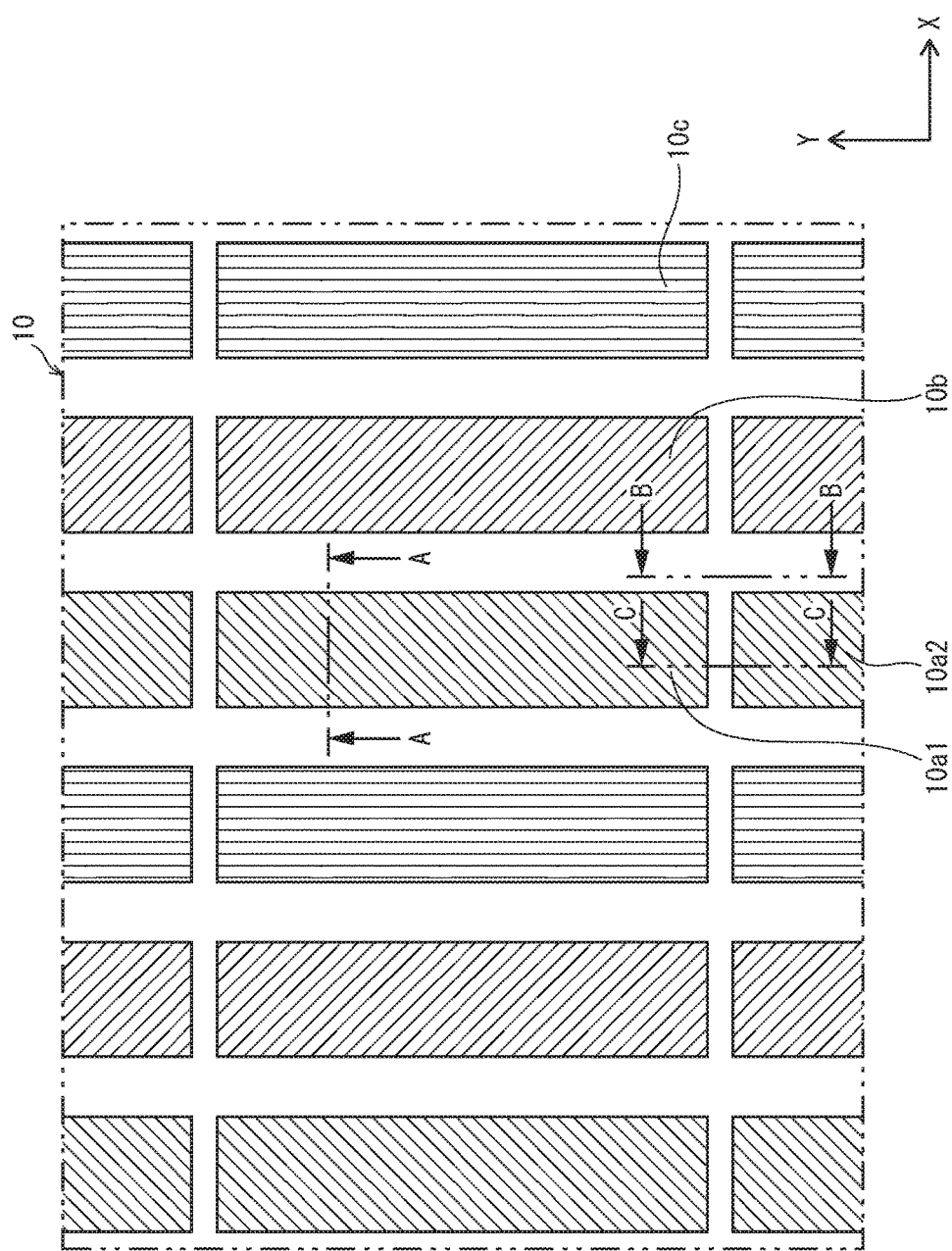
FIG. 2 is a schematic plan view diagram illustrating an arrangement of sub-pixels $10a_1$, $10a_2$, $10b$, $10c$ in a display panel 10.

The following describes the overall structure of the organic EL display device 1 pertaining to the present embodiment, with reference to FIGS. 1 and 2.

As illustrated in FIG. 1, the organic EL display device 1 pertaining to the present embodiment is an organic EL display device including a display panel 10 and a drive and control circuit unit 20 connected to the display device 1. The display device 10 is one type of an organic light-emitting device, and specifically, is an organic EL panel utilizing the electric-field light-emission phenomenon of organic material.

As illustrated in FIG. 2, the display panel 10 has sub-pixels $10a_1$ and $10a_2$, sub-pixels $10b$, and sub-pixels $10c$. The sub-pixels are arranged in a two-dimensional arrangement along a plane defined by the X-axis and Y-axis directions. The present embodiment is based on an example where each of sub-pixels $10a_1$ and $10a_2$ is a light-emitters emitting red (R) light, each sub-pixel $10b$ is a light-emitter emitting green (G) light, and each sub-pixel $10c$ is a light-emitter emitting blue (B) light. Further, a set of one sub-pixel $10a_1$, one sub-pixel $10b$, and one sub-pixel $10c$ that are adjacent to one another in the X-axis direction composes one pixel.

Referring to FIG. 1 once again, the drive and control circuit unit 20 includes four drive circuits, namely drive circuits 21, 22, 23, and 24, and a control circuit 25. Note that in the organic EL display device 1, the display panel 10 and the drive and control circuit unit 20 need not be arranged with respect to one another as illustrated in FIG. 1.

Further, each pixel need not be composed of a set of three sub-pixels $10a_1$, $10b$, and $10c$ as illustrated in FIG. 2, and instead, may be composed of a set of four or more sub-pixels.

2. Structure of Display Panel 10

Figure 3:
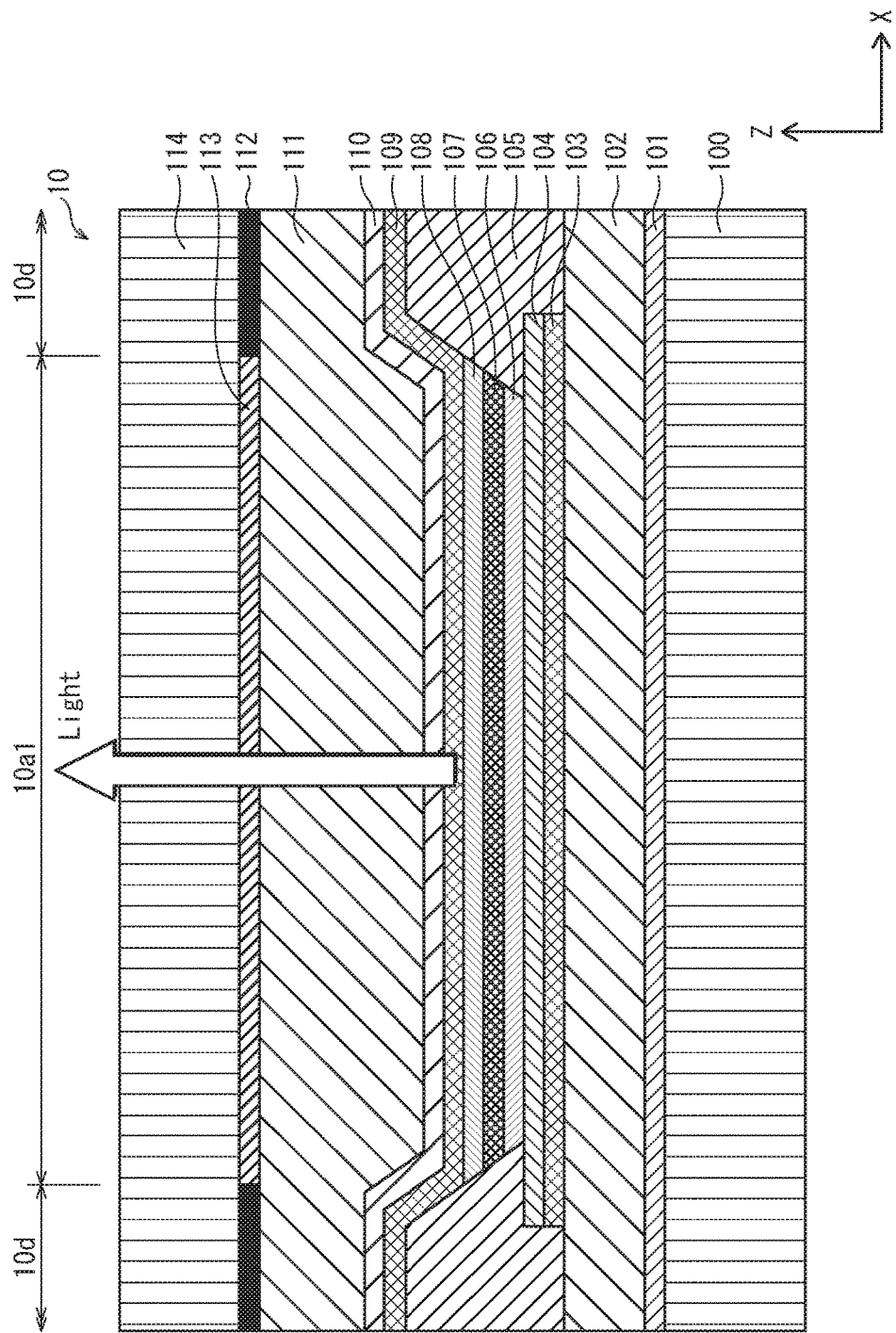
FIG. 3 is a schematic cross-sectional diagram illustrating the structure of an A-A cross-section in FIG. 2.
Figure 4:
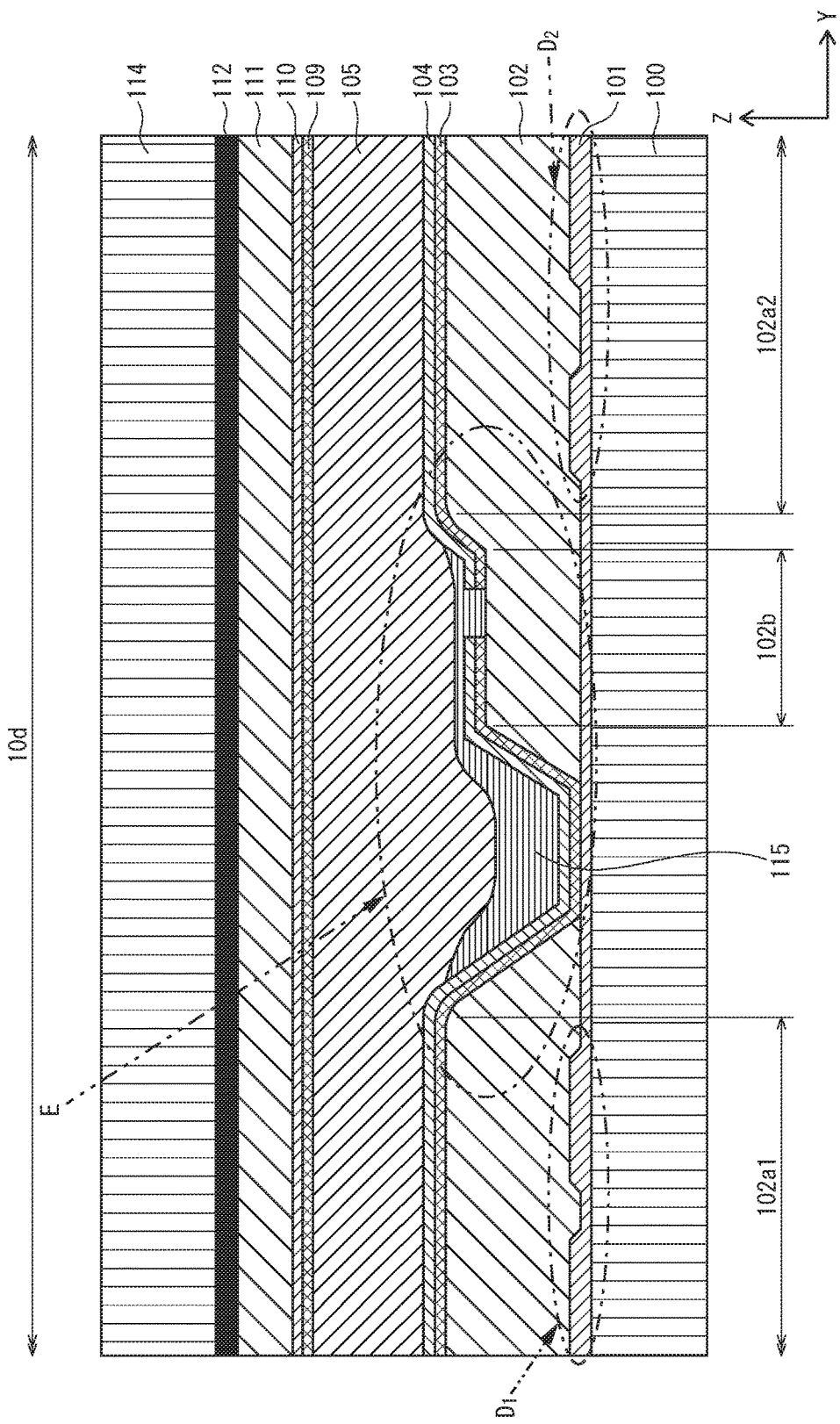
FIG. 4 is a schematic cross-sectional diagram illustrating the structure of a B-B cross-section in FIG. 2.
Figure 5:
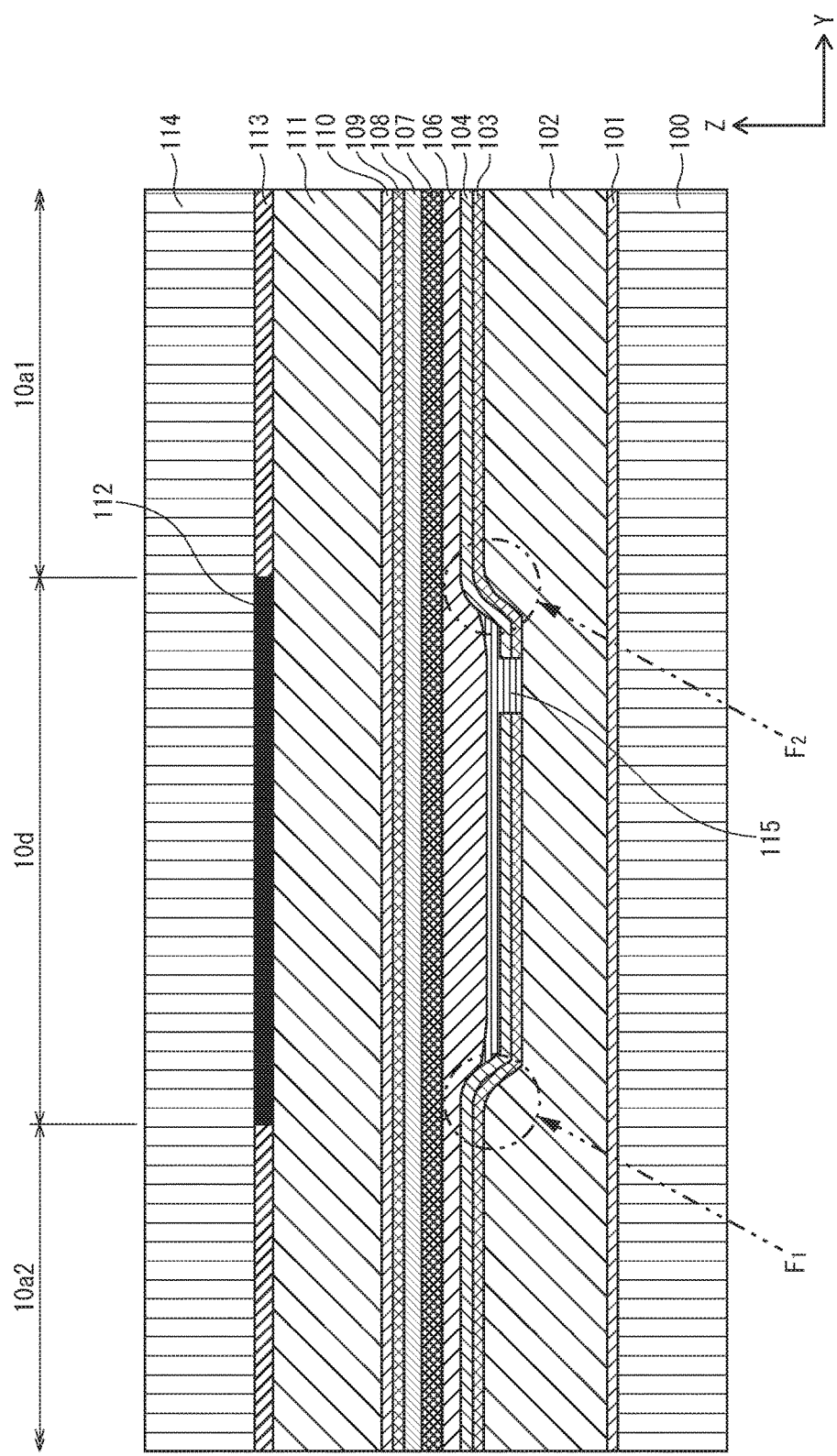
FIG. 5 is a schematic cross-sectional diagram illustrating the structure of a C-C cross-section in FIG. 2.

The following describes the structure of the display panel 10, with reference to FIGS. 3 through 5. FIG. 3 illustrates a cross-section taken along line A-A in FIG. 2, FIG. 4 illustrates a cross-section taken along line B-B in FIG. 2, and FIG. 5 illustrates a cross-section taken along line C-C in FIG. 2.

As illustrated in FIG. 3, a sub-pixel $10a_1$ in the display panel 10 has a structure where a plurality of functional layers are disposed between two substrates, namely a substrate 100 and a substrate 114.

The substrate 100, which is the substrate located lower in the Z-axis direction, has a TFT layer 101 disposed thereon. The TFT layer 101 is not illustrated in drawings such as FIG. 3. The TFT layer 101 is a thin-film transistor layer having a conventional structure. In FIG. 3, the upper surface of the TFT layer 101 is illustrated as being flat. However, actually, due to the TFT layer 101 including transistor element portions, the upper surface of the TFT layer 101 has level differences.

A combination of an anode 103 and a hole injection layer 104 is disposed above the TFT layer 101 in this order from down to up in the Z-axis direction. Further, an insulating layer 102 is disposed between the TFT layer 101 and the combination of the anode 103 and the hole injection layer 104. The insulating layer 102 is one example of a first insulating layer.

Further, banks 105 are disposed to cover the insulating layer 102 and X-axis direction edge portions of and the hole injection layer 104. The banks 105 define the X-axis direction area of the sub-pixel $10a_1$.

Inside an opening whose X-axis direction ends are defined by the banks 105, a hole transport layer 106, an organic light-emitting layer 107, and an electron transport layer 108 are disposed in this order from down to up in the Z-axis direction. In the present embodiment, these three layers (i.e., the hole transport layer 106, the organic light-emitting layer 107, and the electron transport layer 108) form an organic laminate.

Further, a cathode 109 and a sealing layer 110 are disposed in this order from down to up in the Z-axis direction to cover the electron transport layer 108 and top surfaces of the banks 105.

Meanwhile, a color filter layer 113 and black matrix layers 112 are disposed on an Z-axis direction lower main surface of the substrate 114, which is the substrate located higher in the Z-axis direction. An area where a black matrix layer 112 is disposed is a non-light-emitting portion $10d$.

A resin layer 111 is disposed between the sealing layer 110 and the color filter 113 and between the sealing layer 110 and the black matrix layers 112. The resin layer 111 is in gapless close contact with each of the sealing layer 110, the color filter layer 113, and the black matrix layers 112.

The display panel 10 pertaining to the present embodiment is a top-emission display panel, and thus emits light upwards in the Z-axis direction as shown by the arrow in FIG. 3.

The rest of the sub-pixels of the display panel 10 (i.e., the sub-pixels $10a_2$, $10b$, and $10c$) also have structures similar to the structure described above.

Meanwhile, FIG. 4 illustrates a non-light-emitting portion $10d$. In the non-light-emitting portion $10d$, an inter-electrode insulating layer 115 is disposed at an area below a bank 105 (indicated by arrow E in FIG. 4). The inter-electrode insulating layer 115 has a portion between a pair of anodes 103 adjacent in the Y-axis direction and between a pair of hole injection layers 104 adjacent in the Y-axis direction, as illustrated in FIG. 4. Further, the inter-electrode insulating layer 115 also has a portion extending over end portions of the anodes 103, and this portion also covers the hole injection layer 104. The inter-electrode insulating layer 115 is one example of a second insulating layer.

Further, as illustrated in FIG. 4, one of the anodes 103 is connected to one electrode of the TFT layer 101, within an area of the specific anode 103 covered by the inter-electrode insulating layer 115. This electrode may be either a source electrode, a drain electrode, or a TFT upper electrode that is connected to the source electrode or the drain electrode. This connection (contact) is not illustrated in detail in FIG. 4.

Further, the insulating layer 102 has an area $102a_1$, an area $102a_2$, and an area $102b$ between the areas $102a_1$ and $102a_2$. The area $102b$ is located at the right hand side of the area of contact, and the upper surface of the insulating layer 102 is located lower in the Z-axis direction at the area $102b$ than at the areas $102a_1$ and $102a_2$. Further, the anodes 103 and the hole injection layers 104 are disposed along the upper surface of the insulating layer 102, and due to this, upper surfaces of portions of these layers above the area $102b$ are lower than upper surfaces of portions of these layers above the areas $102a_1$ and $102a_2$.

FIG. 5 illustrates another light-emitting portion $10d$ that includes the inter-electrode insulating layer 115 described above. The non-light-emitting portion $10d$ in FIG. 5 is an area between sub-pixels $10a_1$ and $10a_2$ in the Y-axis direction, and the non-light-emitting portion $10d$ includes a black matrix layer 112.

In both FIGS. 4 and 5, an upper surface of a portion of an anode 103 that is covered by an inter-electrode insulating layer 115 is lower than upper surfaces of other portions of the anode 103. Meanwhile, transistor element portions of the TFT layer 101 are disposed in connection with the above-described shape of the insulating layer 102. That is, the transistor element portions are arranged such that the upper surface of the TFT layer 101 has greater Z-axis direction height at the areas $102a_1$ and $102a_2$ (indicated by arrows $D_1$ and $D_2$ in FIG. 4) than at other areas. Thus, even at the area 102b where the insulating layer 102 has relatively small height, a sufficient Z-axis direction distance is secured between the upper surface of the TFT layer 101 and the anodes 103 formed on the upper surface of the insulating layer 102. This structure prevents the occurrence of electric leakage.

Further, as illustrated in FIGS. 4 and 5, the insulating layer 102 has step portions (indicated by arrows $F_1$ and $F_2$ in FIG. 5). Above each step portion, a step portion is also formed in an anode 103 and a hole injection layer 104. Each of the anode 103 and the hole injection layer 104 has, at the upper corner of this step portion, the shape of an outward convex curve. Due to this, even though the upper corners of these layers are not covered by the inter-electrode insulating layer 115, the occurrence of edge emission at the upper corners is suppressed. Thus, this structure suppresses a decrease in panel lifetime.

Further, in the display panel 10, the upper surface of the inter-electrode insulating layer 115 is lower than upper surfaces of portions of the anodes 103 in the sub-pixels (light-emitting portions) $10a_1$, $10a_2$, 10b, 10c. The effect(s) of this structure is described later in the present disclosure.

3. Materials of Components of Display Panel 10

(1) Substrate 100

The substrate 100 is formed by using, for example, a glass substrate, a quartz substrate, a silicon substrate, a metal substrate made of a metal such as molybdenum sulfide, copper, zinc, aluminum, stainless steel, magnesium, iron, nickel, gold, or silver, a semiconductor substrate made of a semiconductor such as gallium arsenide, or a plastic substrate.

When using a plastic substrate, the plastic substrate may be formed by using a thermoplastic resin or a thermosetting resin. For example, usable resins include polyolefin (e.g., polyethylene, polypropylene, ethylene-propylene copolymer, ethylene-vinyl acetate copolymer (EVA)), cyclic polyolefin, denatured polyolefin, polyvinyl chloride, polyvinylidene chloride, polystyrene, polyamide, polyimide (PI), polyamide-imide, polycarbonate, poly-(4-methylpentene-1), ionomer, acrylic resin, polymethyl methacrylate, acrylic-styrene copolymer (AS resin), butadiene-styrene copolymer, ethylene-vinyl alcohol copolymer (EVOH), polyester (e.g., polyethylene terephthalate (PET), polybutylene terephthalate, polyethylene naphthalate (PEN), polycyclohexane terephthalate (PCT)), polyether, polyether ketone, polyether sulfone (PES), polyether imide, polyacetal, polyphenylene oxide, denatured polyphenylene oxide, polyarylate, aromatic polyester (e.g., liquid crystal polymer), fluoro resin (e.g., polytetrafluoroethylene, polyfluorovinylidene), thermoplastic elastomer (e.g., styrene-based elastomer, polyolefin-based elastomer, polyvinylchloride-based elastomer, polyurethane-based elastomer, fluororubber-based elastomer, chlorinated polyethylene-based elastomer), epoxy resin, phenolic resin, urea resin, melamine resin, unsaturated polyester, silicone resin, or polyurethane, or a copolymer, a blended body or a polymer alloy each having at least one of these materials as a major component thereof, and the plastic substrate may be a laminate of one or more of these materials.

(2) TFT Layer 101

The TFT layer 101 includes at least one transistor element portion per sub-pixel. Each transistor element portion includes three electrodes (i.e., the gate, source, and drain electrodes), a semiconductor layer, and a passivation layer.

(3) Insulating Layer 102

The insulating layer 102 is formed by using, for example, an organic compound such as polyimide, polyamide, or an acrylic resin. Further, the insulating layer 102 preferably has resistance against organic solvents.

Further, in the manufacturing process, processing such as etching and baking may be performed with respect to the insulating layer 102. Taking this into account, the insulating layer 102 is preferably formed by using a material having high resistance against such processing and thus does not undergo excessive deformation, deterioration, and the like in such processing.

(4) Anodes 103

The anodes 103 are formed by using a metal material containing silver (Ag) or aluminum (Al). In the display panel 10, which is a top-emission-type panel, the anodes 103 preferably have high optical reflectivity at surface portions thereof.

The anodes 103 need not be composed of a single layer formed by using the above-described metal material. For example, the anodes 103 may be a laminate of a metal layer and a light-transmissive, electrically-conductive layer. In this case, the light-transmissive, electrically-conductive layer may be formed by using, for example, indium tin oxide (ITO) or indium zinc oxide (IZO).

(5) Hole Injection Layers 104

For example, the hole injection layers 104 are formed by using an oxide of a material such as silver (Ag), molybdenum (Mo), chromium (Cr), vanadium (V), tungsten (W), nickel (Ni), or iridium (Ir), or an electrically-conductive polymer material such as polyethylenedioxythiophene (PEDOT; mixture of polythiophene and polystyrene sulfonic acid).

The hole injection layers 104, when formed by using a metal oxide among the materials described above, have a greater work function compared to the hole injection layers 104, when formed by using an electrically-conductive polymer material such as PEDOT, and have functions of assisting the generation of holes and stably injecting holes to the organic light-emitting layers 107.

Further, the hole injection layers 104, when formed by using an oxide of a transition metal, have multiple energy levels due to oxides of transition metals having multiple oxidation states. This results in the hole injection layers 104 readily performing hole injection and thus achieving a reduction in driving voltage. In particular, forming the hole injection layers 104 by using tungsten oxide ($WO_x$) is beneficial, in order to provide the hole injection layers 104 with the functions of stable hole injection and hole generation assistance.

(6) Banks 105

The banks 105 are formed by using an organic material such as a resin, and have an insulating property. Examples of organic materials usable for forming the banks 105 include an acrylic resin, a polyimide resin, and a novolac type phenolic resin. Further, surfaces of the banks 105 may be treated with fluorine, in which case the surfaces of the banks 105 are provided with liquid repellency.

Further, the banks 105 need not be composed of a single layer as illustrated in FIGS. 3 and 4, and instead may be composed of two or more layers. When configuring the banks 105 to have such a multi-layer structure, the layers may each contain a combination of the materials described above, or the layers may include one or more layers containing inorganic material and one or more layers containing organic material.

(7) Inter-Electrode Insulating Layers 115

The inter-electrode insulating layers 115 may be formed by using, for example, an inorganic insulating material such as silicon oxide ($SiO_2$), silicon nitride (SiN), or silicon oxynitride (SiON), or an organic insulating material.

Specific examples of organic insulating materials usable for forming the inter-electrode insulating layer 115 include acrylic resin, polyimide resin, siloxane resin, and phenolic resin.

(8) Hole Transport Layers 106

The hole transport layers 106 are made by using a high molecular compound without any hydrophilic groups. For example, the hole transport layers 106 may be formed by using a high molecular compound, such as polyfluorene or a derivative thereof or polyarylamine or a derivative thereof, without any hydrophilic groups.

(9) Organic Light-Emitting Layers 107

The organic light-emitting layers 107 are put in excitation state when holes and electrons are injected and recombine therein, and emit light in this excitation state. The organic light-emitting layers 107 are beneficially formed by using an organic material which has a light-emitting property and a film of which can be formed through wet printing.

For example, the organic light-emitting layers 107 are preferably formed by using one of the fluorescent materials disclosed in Japanese Patent Application Publication No. H05-163488, which include: an oxinoid compound; a perylene compound; a coumarin compound; an azacoumarin compound; an oxazole compound; an oxadiazole compound; a perinone compound; a pyrrolo-pyrrole compound; a naphthalene compound; an anthracene compound; a fluorene compound; a fluoranthene compound; a tetracene compound; a pyrene compound; a coronene compound; a quinolone compound; an azaquinolone compound; a pyrazoline derivative and a pyrazolone derivative; a rhodamine compound; a chrysene compound; a phenanthrene compound; a cyclopentadiene compound; a stilbene compound; a diphenylquinone compound; a styryl compound; a butadiene compound; a dicyanomethylene pyran compound; a dicyanomethylene thiopyran compound; a fluorescein compound; a pyrylium compound; a thiapyrylium compound; a selenapyrylium compound; a telluropyrylium compound; an aromatic aldadiene compound; an oligophenylene compound; a thioxanthene compound; a cyanine compound; an acridine compound; a metal complex of an 8-hydroxyquinoline compound; a metal complex of a 2-bipyridine compound; a complex of a Schiff base and a group III metal; a metal complex of oxine; and rare earth metal complex.

(10) Electron Transport Layers 108

The electron transport layers 108 have the function of transporting electrons injected from the cathode 109 to the organic light-emitting layers 107. The electron transport layers 108 are formed, for example, by using an oxidiazole derivative (OXD), a triazole derivative (TAZ), or a phenanthroline derivative (BCP, Bphen).

(11) Cathode 109

The cathode 109 is, for example, formed by using indium tin oxide (ITO) or indium zinc oxide (IZO). In the display panel 10, which is a top-emission-type panel, it is necessary to form the cathode 109 by using a material having optical transmissivity. Further, the cathode 109 preferably has an optical transmittance of 80% or higher.

(12) Sealing Layer 110

The sealing layer 110 prevents organic layers such as the organic light-emitting layer 106 from being exposed to moisture, ambient air, etc. For example, the sealing layer 110 is formed by using a material such as SiN or SiON. Further, the sealing layer 110 may include, in addition to a layer formed by using SiN or SiON, a sealing resin layer formed by using a resin material such as acrylic resin or silicone resin.

In the display panel 10, which is a top-emission-type panel, it is necessary to form the sealing layer 110 by using a material having optical transmissivity.

(13) Resin Layer 111

For example, the resin layer 111 is formed by using an optically transmissive resin material such as an epoxy resin material. Alternatively, the resin layer 111 may be formed by using silicone resin or the like.

(14) Black Matrix Layers 112

The black matrix layers 112 are, for example, formed by using an ultraviolet curing resin material containing black pigment that absorbs light excellently and achieves an excellent light blocking effect. One specific example of such ultraviolet curing resin material is acrylic resin.

(15) Color Filter Layers 113

The color filter layers 113 of the colors red (R), green (G), and blue (B) are formed by using conventional materials selectively allowing visible light of a wavelength region of the corresponding color to pass through. For example, the color filter layers 113 may be formed by using acrylic resin as a base material.

(16) Substrate 114

Similar to the substrate 100, the substrate 114 is formed by using, for example, a glass substrate, a quartz substrate, a silicon substrate, a metal substrate made of a metal such as molybdenum sulfide, copper, zinc, aluminum, stainless steel, magnesium, iron, nickel, gold, or silver, a semiconductor substrate made of a semiconductor such as gallium arsenide, or a plastic substrate. Similar to the substrate 100, when using a plastic substrate for the substrate 114, the plastic substrate may be formed by using a thermoplastic resin or a thermosetting resin.

4. Shape of Inter-Electrode Insulating Layer 115

Figure 6:
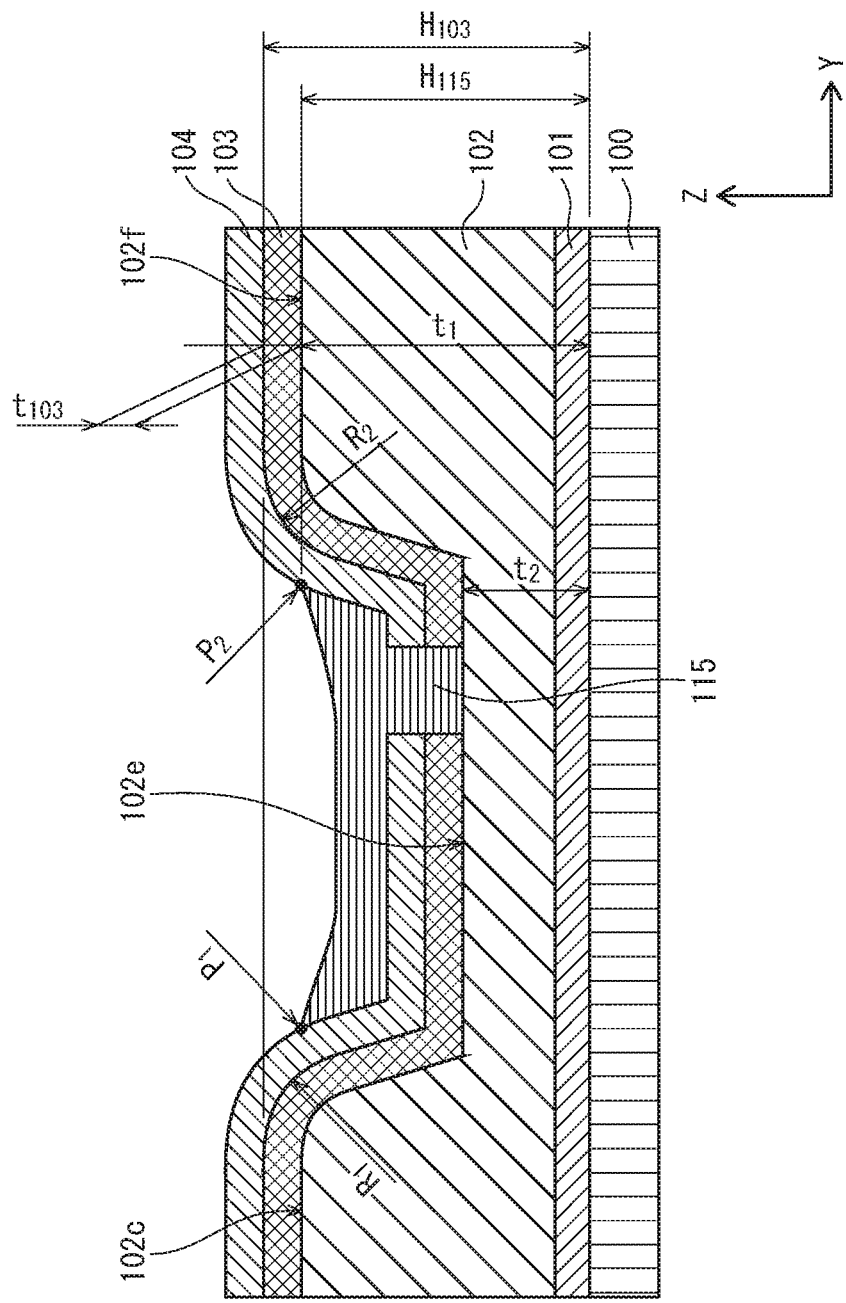
FIG. 6 is a schematic cross-sectional diagram providing enlarged schematic illustration of a portion where an inter-electrode insulating layer 115 has been formed and a surrounding of the portion.

The following describes, with reference to FIG. 6, the shape of an inter-electrode insulating layer 115, an anode 103, and the like. FIG. 6 is a schematic diagram illustrating a portion where one inter-electrode insulating layer 115 is disposed, and a surrounding of this portion. FIG. 6, due to being a schematic, does not illustrate components at their actual scales and the like.

As illustrated in FIG. 6, the inter-electrode insulating layer 115 is disposed above a Z-axis direction recess portion 102e of the insulating layer 102. In the recess portion 102e, ends of two anodes 103 that are adjacent in the Y-axis direction face one another with a gap therebetween, and a portion of the inter-electrode insulating layer 115 is present in this gap.

Above the recess portion 102e, the inter-electrode insulating layer 115 has a portion covering the end portions of anodes 103 and hole injection layers 104. Further, the upper surface of the inter-electrode insulating layer 115 extends between end points $P_1$ and $P_2$. Here, $H_{115}$, which is the height of the points $P_1$, $P_2$ from the Z-direction upper surface of the substrate 100, and $H_{103}$, which is the height, from the Z-direction upper surface of the substrate 100, of the upper surfaces of the portions of the anodes 103 on portions 102c and 102f, which are portions of the insulating layer 102 surrounding the recess portion 102e, satisfy the following relationship.

$$H_{115} < H_{103} \quad [\text{Math. 1}]$$

In addition, in the present embodiment, $t_2$, which is the height of the upper surface of the insulating layer 102 at the recess portion 102e, and $t_1$, which is the height of the upper surface of the insulating layer 102 at the portions 102c and 102f, satisfy the following relationship.

$$t_1 - t_2 \geq t_{103} \quad [\text{Math. 2}]$$

Note that $t_{103}$ in Math. 2 denotes the thickness of portions of the anodes 103 that are located on the portions 102c and 102f of the insulating layer 102.

Forming the inter-electrode insulating layer 115 to satisfy these relationships effectively suppresses insufficient wetting with ink for forming an organic film on or above the hole injection layers 104, such as the hole transport layers 106, from occurring when ink application is performed. In addition, this also has the effect of securing a wide permissible range of minimum ink application amount in the forming of the organic film through ink application, and thus ensures that the organic film has sufficient film thickness.

Further, in the present embodiment, an anode 103/hole injection layer 104 has a step portion (between a portion above recess portion 102e and a portion above portion 102c/102f), and the upper corner of the step portion has the shape of an outward convex curve. Specifically, taking the anodes 103 illustrated in FIG. 6 as an example, each anode 103 has a corner curve R (corner curve $R_1$ or $R_2$) at the upper corner.

Here, the corner curve $R_1$ and the corner curve $R_2$ may be the same or may differ from one another. Configuring the corner curves $R_1$ and $R_2$ to be the same reduces the complexity of design, in terms of a mask, etc., used in manufacturing. Meanwhile, configuring the corner curves $R_1$ and $R_2$ to differ from one another enables flexible design taking into consideration shapes of other portions.

The upper corners of the anodes 103 and the hole injection layers 104 are provided with the shape of an outward convex curve as described above to suppress the occurrence of edge emission at such portions, which are not covered by the inter-electrode insulating layer 115. Typically, the occurrence of edge emission brings about a decrease in overall device lifetime. However, providing the upper corners of the anodes 103 and the hole injection layers 104 with the curved shapes illustrated in FIG. 6 suppresses the occurrence of edge emission and thus extends device lifetime.

Further, in the present embodiment, a hole injection layer 104 is disposed on each anode 103, and a portion of the hole injection layer 104 is covered by the inter-electrode insulating layer 115. With such a structure, it is preferable to also provide upper corners of hole injection layers 104 with a curved shape, as described above.

Further, while FIG. 6 illustrates the cross-section illustrated in FIG. 5, the cross-sectional portion illustrated in FIG. 4 also includes an inter-electrode insulating layer 115 having the shape described above.

Further, in the direction perpendicular to the drawing sheet of FIG. 6 (i.e., the X-axis direction), aspects such as the positions of the end points (i.e., points $P_1$, $P_2$) of an upper surface of an inter-electrode insulating layer 115 and shapes of upper corners of anodes 103/hole injection layers 104 need not be the same. That is, fluctuation in such aspects is tolerated, as long as Math. 1 and Math. 2 provided above are satisfied.

5. Manufacturing Method of Display Panel 10

Figure 7:
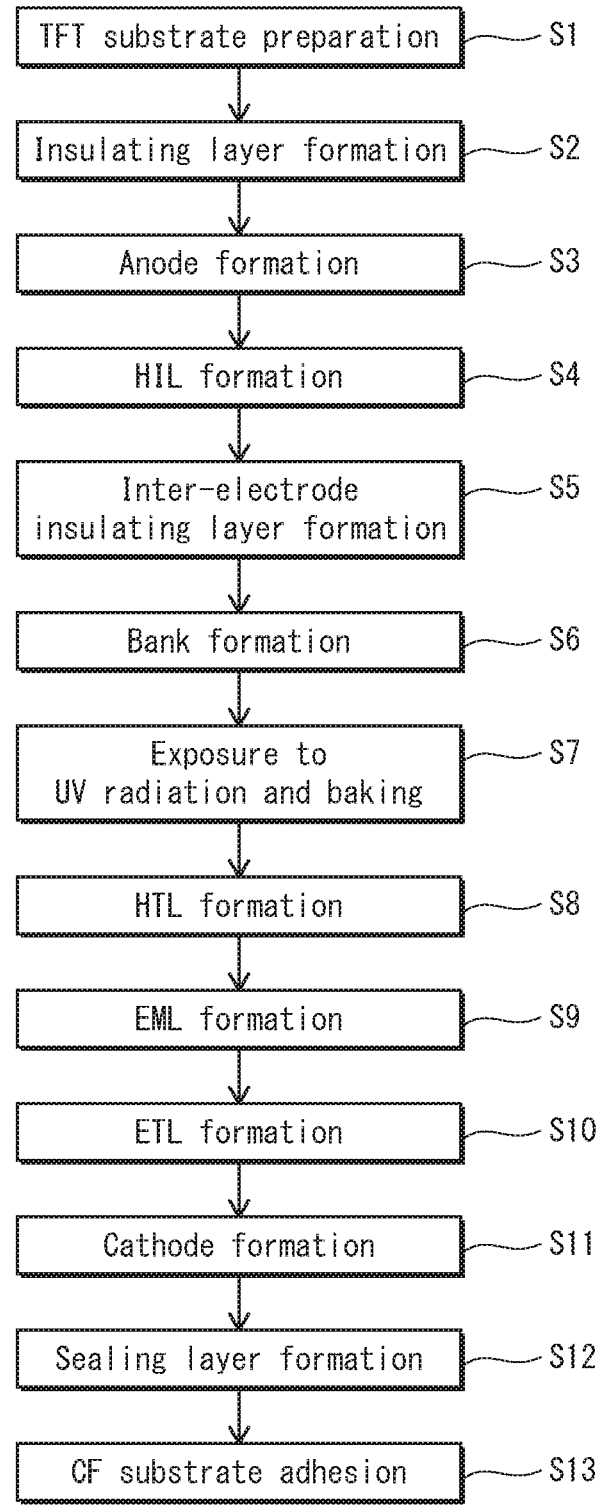
FIG. 7 is a schematic diagram illustrating manufacturing procedures of the display panel 10.
Figure 8A:
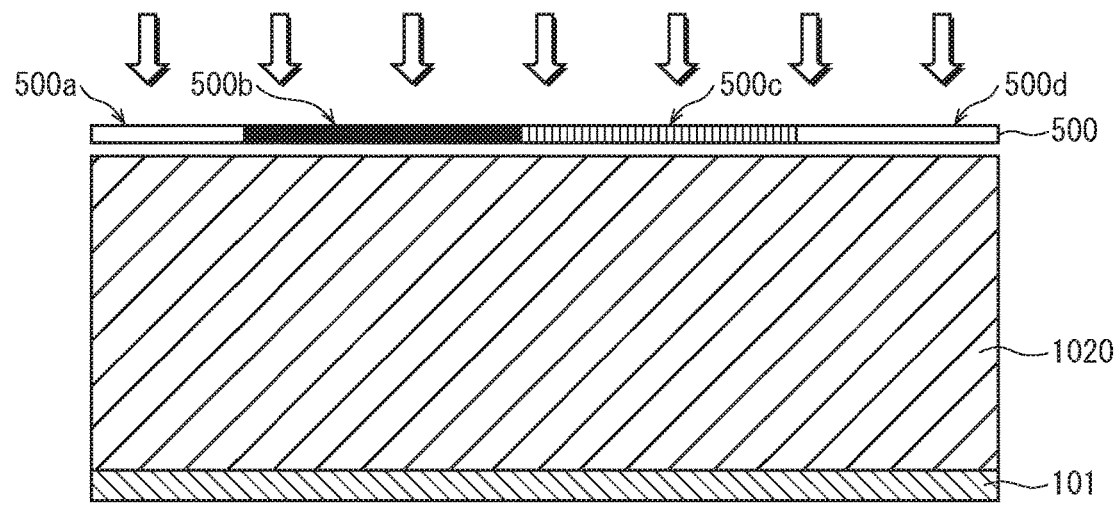
FIG. 8A is a schematic diagram illustrating exposure performed in the forming of an insulating layer 102, among the manufacturing procedures of the display panel 10.
Figure 8B:
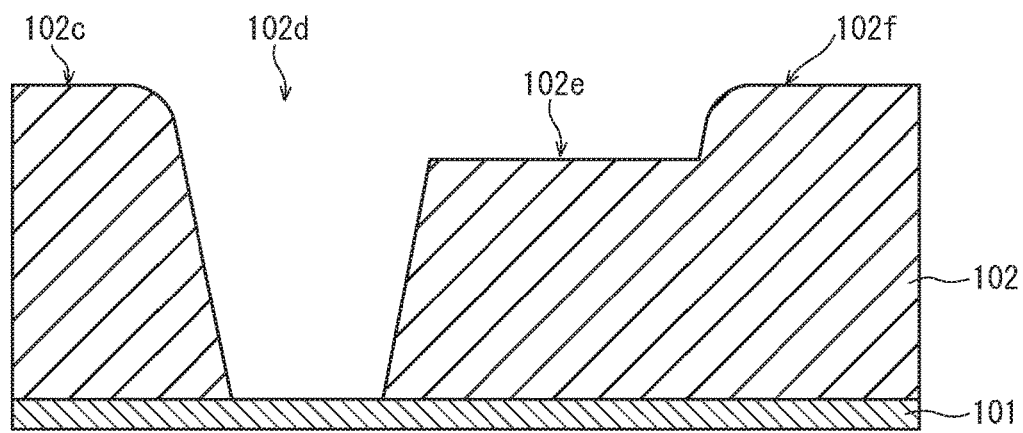
FIG. 8B is a schematic cross-sectional diagram illustrating the insulating layer 102, having been yielded as a result of developing.

The following provides an overview of a manufacturing method of the display panel 10 pertaining to the present embodiment, with reference to FIG. 7 and FIGS. 8A and 8B.

FIG. 7 illustrates manufacturing procedures of the display panel 10 in which first, a TFT substrate is prepared (Step S1). The TFT substrate is prepared by forming the TFT layer 101 on the upper surface of the substrate 100, and the preparation is performed through application of conventional technology.

Subsequently, the insulating layer 102 is formed on the TFT substrate (Step S2). In the forming of the insulating layer 102, first, an insulating material film 1020 is formed by applying an organic material onto the passivation film of the TFT layer 101. Subsequently, exposure is performed with a mask 500 arranged over the insulating material film 1020, as illustrated in FIG. 8A. The mask 500 is a halftone mask that has light transmitting portions 500a, 500d, a light blocking portion 500b, and a halftone portion 500c.

After the exposure, developing of the insulating material film 1020 is performed as illustrated in FIG. 8B. This yields the insulating layer 102, which has portions 102c and 102f, a recess portion 102e, and a contact hole 102d. Note that the insulating layer 102 is substantially flat at the portions 102c and 102f and the recess portion 102e.

Referring to FIG. 7 once again, the forming of the anodes 103 on the insulating layer 102 and the forming of the hole injection layers 104 above the insulating layer 102 are performed in the stated order (Steps S3 and S4). In the forming of the anodes 103, first, a metal film is formed through sputtering or vacuum vapor deposition, and then the metal film having been formed is patterned through photolithography or etching. While not illustrated in any of the drawings, each of the anodes 103 is electrically connected to an upper electrode (electrode connected to a source electrode or a drain electrode) of the TFT layer 101 via a contact hole 102d (refer to FIG. 8B) formed in the insulating layer 102.

The forming of the hole injection layers 104 includes, for example, forming a metal oxide film (for example, a tungsten oxide film) through sputtering, and then patterning the metal oxide film through photolithography and etching into portions corresponding to the sub-pixels $10a_1$, $10a_2$, $10b$, and $10c$.

Subsequently, the inter-electrode insulating layers 115 are formed (Step S5). For example, in the forming of the inter-electrode insulating layers 115, first, a film made of an insulating material (e.g., photosensitive acrylic resin material) for the inter-electrode insulating layer 115 is formed through spin-coating. Then, this resin film is patterned through exposure and developing. Here, the patterning is performed to provide the inter-electrode insulating layers 115 with the shape illustrated in FIG. 6.

Subsequently, the banks 105 are formed (Step S6). For example, in the forming of the banks 105, first, a film of an insulating material (e.g., photosensitive resin material) for the banks 105 is formed through spin-coating to extend over the entire substrate 100 having the inter-electrode insulating layers 115 formed thereon. Then, similar to the forming of the inter-electrode insulating layers 115, this resin film is patterned through exposure and developing.

Subsequently, exposure to ultraviolet (UV) radiation and baking are performed of the banks 105 and the inter-electrode insulating layers 115 formed as described above (Step S7). The exposure to UV radiation is performed, for example, for 150 to 200 seconds. The baking is performed, for example, at a temperature of 230 degrees Celsius for 10 to 20 minutes.

Subsequently, in each groove area defined by a pair of adjacent banks 105, a hole transport layer 106 is formed (Step S8). In the forming of the hole transport layers 106, an ink containing material for the hole transport layers 106 is applied to each groove area between adjacent banks 105 through printing (ink application), and then baking of the applied ink is performed. Here, note that the hole transport layers 106 are formed to cover the inter-electrode insulating layers 115 exposed at the bottom of the groove areas defined by the banks 105.

Subsequently, the forming of the organic light-emitting layer 107 in each groove area between adjacent banks 105 is performed (Step S9), and then, the forming of the electron transport layer 108 in each groove area between adjacent banks 105 is performed (Step S10). The forming of the organic light-emitting layers 107 and the forming of the electron transport layers 108 are each performed in a manner similar to the forming of the hole transport layers 106, through application of an ink containing the material for the target layer, and baking the applied ink.

Subsequently, the cathode 109 and the sealing layer 110 are formed in the stated order to cover the electron transport layers 108 and the top surfaces of the banks 105 (Steps S11, S12). For example, the cathode 109 and the sealing layer 110 are each formed through sputtering.

Subsequently, adhesion of a color filter substrate prepared by forming color filter layers 113 and black matrix layers 112 on the substrate 114 is performed (Step S13). This completes the manufacturing of the display panel 10.

Embodiment 2

Figure 9B:
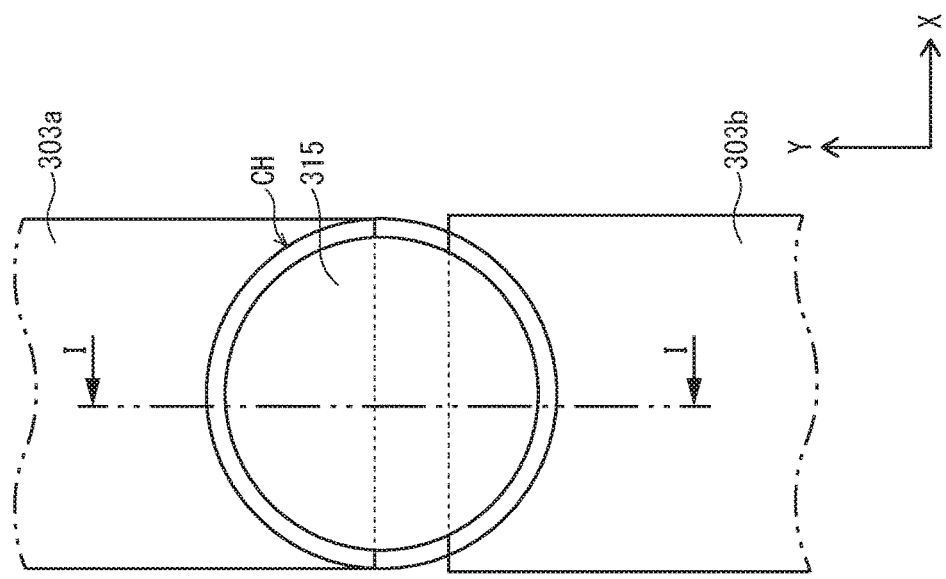
FIG. 9B is a schematic plan view diagram illustrating only the anodes 303a, 303b and the inter-electrode insulating layer 315.
Figure 9A:
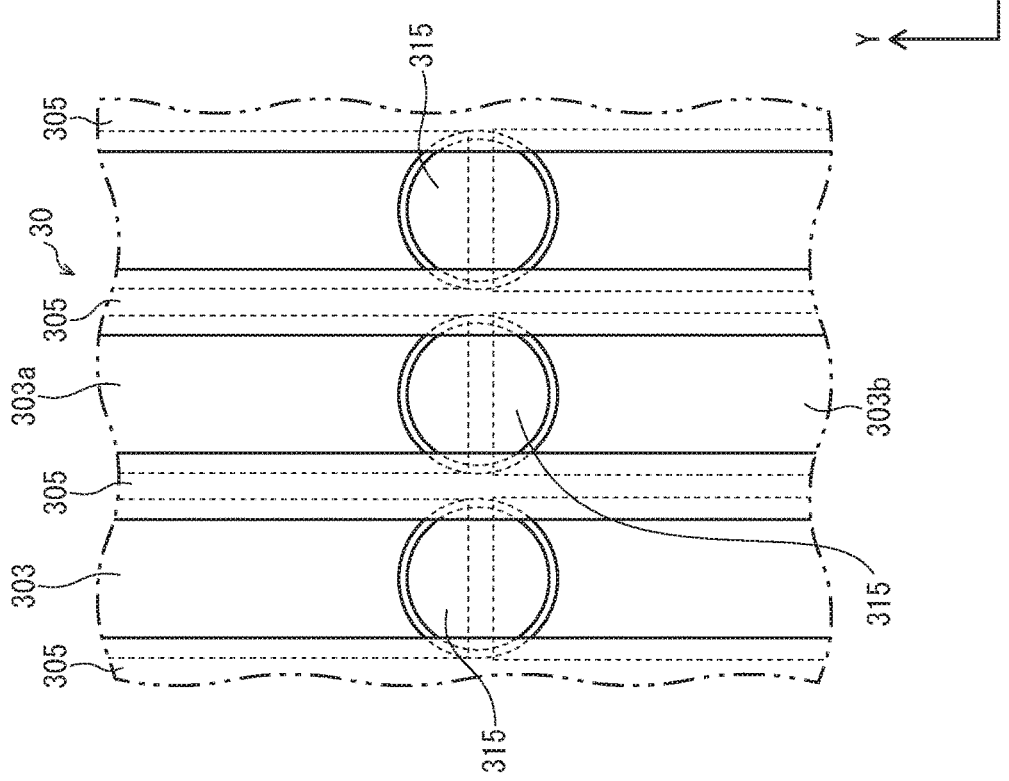
FIG. 9A is a schematic plan view diagram illustrating an arrangement of anodes 303, 303a, 303b, banks 305, and an inter-electrode insulating layer 315 in a display panel 30 pertaining to embodiment 2 of the present invention.
Figure 10:
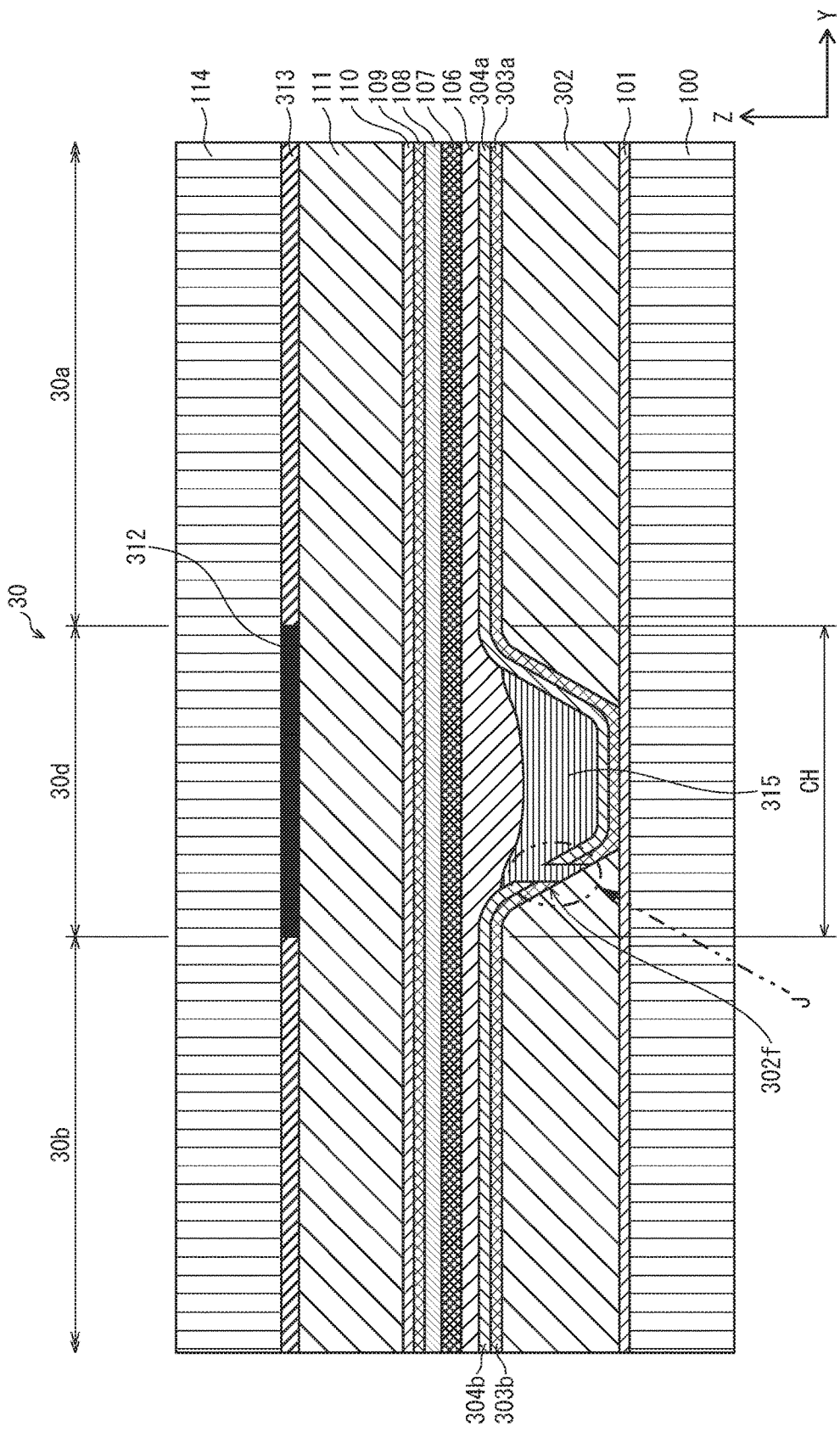
FIG. 10 is a schematic cross-sectional diagram illustrating the structure of an I-I cross-section in FIG. 9B.

The following describes the structure of an organic EL display device pertaining to embodiment 2, with reference to FIGS. 9A, 9B, and 10. Note that FIGS. 9A, 9B, and 10 each illustrate only a part of a display panel 30 that differs in structure from the display panel 10 in the organic EL display device 1 pertaining to embodiment 1. Meanwhile, embodiment 2 is similar to embodiment 1 in terms of structures not illustrated in these drawings. Further, note that in each of FIGS. 9A and 9B, components disposed above the hole injection layers (i.e., components that are located towards the viewer from the drawings) are not illustrated.

As illustrated in FIG. 9A, the display panel 30 pertaining to the present embodiment has a plurality of linear banks 305 that are spaced away from one another in the X-axis direction. The banks 305 each extend in the Y-axis direction, and thus, form a so-called line-bank structure.

Between adjacent ones of the banks 305, an anode 303 (including anodes 303a and 303b) is disposed to extend along the Y-axis direction. Further, as illustrated in FIG. 9B, at an area where two anodes are located close to one another in the Y-axis direction (i.e., at a gap between anode end portions), a contact hole area CH is disposed. As illustrated in FIGS. 9A and 9B, in the display panel 30 pertaining to the present embodiment, each contact hole area CH has a circular shape, an elliptical shape, or an oval shape in plan view. Further, each contact hole area CH has formed therein an inter-electrode insulating layer 315. The inter-electrode insulating layer 315 is disposed for electrical insulation between anodes 303. Further, the inter-layer insulating layer 315 is formed by using the same material as the inter-electrode insulating layer 115 in embodiment 1.

Further, as illustrated in FIG. 10, the display panel 30 includes an insulating layer 302 having a lateral surface portion defining a contact hole area CH. The lateral surface portion is referred to in the following as a slope portion 302f, and has a tapered shape. Further, FIG. 10 illustrates that anodes (anodes 303a and 303b) and hole injection layers (hole injection layers 304a and 304b) of the display panel 30 are disposed along the surface of the insulating layer 302.

Here, in the display panel 30 pertaining to the present embodiment, a gap between the anodes 303a and 303b (anodes adjacent in the Y-axis direction) is located on the slope portion 302f. In FIG. 10, the gap is indicated by using the arrow J. This similarly applies to the gap between the hole injection layers 304a and 304b (hole injection layers adjacent in the Y-axis direction). Further, a portion of the inter-electrode insulating layer 315 is present in the gap between the anodes 303a and 303b and in the gap between the hole injection layers 304a and 304b.

The inter-electrode insulating layer 315 is similar to the inter-electrode insulating layer 115 in embodiment 1 for also having a portion covering end portions of the anodes 303a, 303b and the hole injection layers 304a, 304b. Further, the upper surface of the inter-electrode insulating layer 315 is lower in the Z-axis direction than the upper surface of a portion of the anode 304a in a sub-pixel 30a and the upper surface of a portion of the anode 304b in a sub-pixel 30b. The sub-pixels 30a, 30b are light-emitting portions. This structure achieves effects similar to those described in embodiment 1.

Note that the area above each contact hole area CH is a non-light-emitting portion 30d including a black matrix layer 312 disposed above the contact hole area CH in the Z-axis direction. Meanwhile, each sub-pixel area (light-emitting portion) (sub-pixel areas 30a and 30b) includes a color filter layer 313.

In the display panel 30 pertaining to the present embodiment, the gap between anodes (anodes 303a and 303b) is disposed on a slope portion 302f defining a contact hole area CH, instead of being disposed above a recess (recess 102b in embodiment 1). This results a non-light-emitting portion 30d in the display panel 30 pertaining to the present embodiment having smaller size than a non-light-emitting portion 10d in the display panel 10. As such, a ratio of a surface area of a non-light-emitting portion (non-light-emitting portion 30d) to a surface area of a light-emitting portion (light-emitting portions 30a and 30b) is smaller in the display panel 30 than in the display panel 10. This is particularly advantageous in achieving high definition. In particular, providing each contact hole area CH with a circular or similar shape in plan view is effective in achieving an increase in light-emitting portion surface area.

Embodiment 3

The following describes the structure of an organic EL display device pertaining to embodiment 3, with reference to FIG. 11. FIG. 11 is a schematic corresponding to FIG. 9B referred to in embodiment 2. The components of the organic EL display device pertaining to the present embodiment not illustrated in FIG. 11 may have similar shapes and structures as those in embodiment 2.

As illustrated in FIG. 11, in the display panel pertaining to the present embodiment, a contact hole area CH is formed at a gap between anodes (anodes 403a and 403b), and the contact hole area CH has a rectangular shape with rounded corners in plan view. Note that however, the shape of the contact hole area CH is not limited to a rectangular shape with rounded corners. Further, the contact hole area CH has formed therein an inter-electrode insulating layer 415. The inter-electrode insulating layer 415 is disposed for electrical insulation between the anodes 403a and 403b. Further, the inter-layer insulating layer 415 is formed by using the same material as the inter-electrode insulating layer 115 pertaining to embodiment 1 and the inter-electrode insulating layer 315 pertaining to embodiment 2.

Providing a contact hole area CH having a rectangular shape in plan view and arranging a gap between anodes (anodes 403a and 403b) on an insulating layer slope portion defining the contact hole area CH in the same manner as illustrated in FIG. 10 reduces ratio of a surface area of a non-light-emitting portion to that of a light-emitting portion. Thus, this structure is advantageous for achieving high definition.

[Other Matters]

In the embodiments, the present invention is described using a display panel (e.g., display panel 10 in embodiment 1 and display panel 30 in embodiment 2) as an example of an organic light-emitting device. However, the present invention is not only applicable to a display panel. For example, the structure pertaining to the present invention may be applied to an organic EL lighting device or the like to achieve the same effects as described above.

Further, as illustrated in FIG. 2, a combination of three sub-pixels (sub-pixels $10a_1$, 10b, and 10c) each having a rectangular shape in plan view composes one pixel in the embodiments. However, the present invention need not have such pixel structure. For example, each sub-pixel of a pixel may have, in plan view, a triangular shape, a hexagonal shape, or an octagonal shape, and/or the sub-pixels may be arranged to form a honeycomb pattern when seen as a whole. Further, each pixel may be composed of four or more sub-pixels. When making such a modification, a configuration may be made such that all sub-pixels composing a pixel emit light of a different color, or a configuration may be made such that some of the sub-pixels composing a pixel emit light of the same color.

In the embodiments, the sub-pixels (sub-pixels $10a_1$, $10a_2$, 10b, and 10c) are disposed in a plan view arrangement such that the sub-pixels form lines in both the X-axis and Y-axis directions and thereby form a matrix. However, as long as sub-pixels are arranged two-dimensionally on a plane along the main surface of the substrate (substrate 100), the sub-pixels need not be arranged as described in the embodiments.

Further, in the embodiments, the forming of the banks (banks 105 and 305) and the forming of the inter-electrode insulating layers (inter-electrode insulating layers 115, 315, and 415) are performed separately. However, the banks and the inter-electrode insulating layers need not be formed separately. For example, a structure similar to those described in the embodiments can also be achieved by forming a film of a bank material over a substrate having the layers from the anodes to the hole injection layers already formed thereon, and performing exposure and developing of the bank material film while varying the exposure/developing conditions between portions that are to become banks and portions that are to become inter-electrode insulating layers. Effects similar to those described above are achieved when making this modification. However, there may be cases where lateral wall portions of the banks and upper surface portions of the inter-electrode insulating layers need to be provided with different levels of liquid repellency against ink used in forming an organic film such as a hole transport layer.

Further, in the embodiments, the inter-electrode insulating layer (inter-electrode insulating layers 115, 315, and 415) is composed of a single layer. However, the inter-electrode insulating layer need not have such a structure. That is, the inter-electrode insulating layer may have a multi-layer structure, composed of two or more layers. When making this modification, a configuration may be made such that the inter-electrode insulating layer has, as a lower portion, an inorganic insulating layer formed through vapor deposition or the like, and has as an upper portion, an organic insulating layer formed through ink application or the like. Alternatively, the inter-electrode insulating layer may be composed of two or more organic or inorganic insulating layers each containing a different material.

Similarly, in the embodiments, the banks (banks 105 and 305) are composed of a single layer. However, the banks need not have such a structure. That is, the banks may have a multi-layer structure, composed of two or more insulating layers. When making this modification, a selection may be made of whether to configure each of the multiple layers of the banks as an organic layer or an inorganic layer, similar to when making the modification of providing the inter-electrode insulating layer with a multi-layer structure.

In the embodiments, the forming of the hole injection layers (hole injection layers 104, 304a, and 304b), as well as the forming of the anodes (anodes 103, 303, 303a, 303b, 403a, and 403b), involves forming of a thin film (through sputtering, vacuum vapor deposition, or the like). Alternatively, the hole injection layers may be formed through ink application. Note that when making this modification, the hole injection layers would be formed in the groove areas defined by the banks (banks 105 and 305) and on inter-electrode insulating layers (inter-electrode insulating layers 115, 315, and 415).

Further, in the embodiments, between the anode (the anodes 103, 303, 303a, 303b, 403a, and 403b) and the organic light-emitting layer (the organic light-emitting layer 107), the hole injection layer (the hole injection layers 104, 304a, and 304b) and the hole transport layer (the hole transport layer 106) are disposed. Note that these layers need not be disposed between the anode and the organic light-emitting layer. Further, one or more other intermediate functional layers may be disposed between the anode and the organic light-emitting layer in addition to these layers. Similarly, in the embodiments, between the organic light-emitting layer (the organic light-emitting layer 107) and the cathode (the cathode 109), the electron transport layer (the electron transport layer 108) is disposed. However, the electron transport layer need not be disposed. Further, one or more other intermediate functional layers may be disposed between the organic light-emitting layer and the cathode in addition to the electron transport layer.

Further, in the embodiments, the anode (the anodes 103, 303, 303a, 303b, 403a, and 403b) is disposed below the organic light-emitting layer (the organic light-emitting layer 107) in the Z-axis direction, and the cathode (the cathode 109) is disposed above the organic light-emitting layer (the organic light-emitting layer 107) in the Z-axis direction. However, the positional relationship of these electrodes relative to the organic light-emitting layer can be reversed. That is, a modification may be made such that the cathode is disposed below the organic light-emitting layer in the Z-axis direction, and the anode is disposed above the organic light-emitting layer in the Z-axis direction. In any case, the electrode at the side of the panel from which light is to be emitted is to be provided with light transmissivity, and the electrode at the opposite side of the panel is to be provided with light reflectivity.

Further, in the embodiments, the display panel (the display panels 10 and 30) is a top-emission-type display panel.

However, the present invention also achieves effects similar to those described above when applied to a bottom-emission-type display panel.

INDUSTRIAL APPLICABILITY

The present invention is useful in achieving an organic light-emitting device and an organic display device with high light-emission performance.

The invention claimed is:

1. An organic light-emitting device comprising:
   a substrate;
   a first insulating layer on or above the substrate; and
   light-emitting portions disposed on or above the first insulating layer in a two-dimensional arrangement in two directions along a main surface of the substrate, wherein
   the light-emitting portions, in a first direction intersecting the substrate main surface, each comprise:
      a first electrode on or above the first insulating layer;
      an organic laminate above the first electrode, the organic laminate at least including an organic light-emitting layer; and
      a second electrode above the organic light-emitting layer, and
   the organic light-emitting device comprises a non-light-emitting portion between adjacent ones of the light-emitting portions in a second direction that is one of the two directions along the main surface of the substrate, the non-light-emitting portion comprising:
      extension portions of the first electrodes of the adjacent light-emitting portions that extend into the non-light-emitting portion; and
      a second insulating layer present between ends of the extension portions and over the extension portions, a height of the second insulating layer from the substrate main surface being lower than a height, from the substrate main surface, of upper surfaces of portions of the first electrodes in the light-emitting portions.

2. The organic light-emitting device of claim 1, wherein the height, from the substrate main surface, of the upper surfaces of the portions of the first electrodes in the light-emitting portions is higher than the height of upper surfaces of the extension portions from the substrate main surface, and
   in each of the first electrodes, a step portion is formed at a boundary between the extension portion and the portion in the light-emitting portion, an upper corner of the step portion having the shape of an outward convex curve and not being covered by the second insulating layer.

3. The organic light-emitting device of claim 2, wherein the light-emitting portions each further comprise
   a charge injection layer disposed between the first electrode and the organic laminate, and
   the charge injection layer has a portion covering the upper corner of the first electrode, the portion of the charge injection layer having the shape of an outward convex curve and not being covered by the second insulating layer.

4. The organic light-emitting device of claim 2, wherein
   a height of an upper surface of the first insulating layer from the main surface of the substrate is higher below the light-emitting portions than below a gap between the ends of the extension portions in the non-light-emitting portion, and
   the first electrodes are disposed along the upper surface of the first insulating layer.

5. The organic light-emitting device of claim 4 further comprising
   a thin film transistor layer between the substrate and the first insulating layer, the thin film transistor layer including a plurality of transistor element portions, wherein
   the transistor element portions are disposed at areas of the thin film transistor layer below the light-emitting portions.

6. The organic light-emitting device of claim 5, wherein the first insulating layer has, for each of the first electrodes, a contact hole electrically connecting the first electrode with a corresponding one of the transistor element portions, the contact hole disposed at an area of the first insulating layer corresponding to the non-light-emitting portion.

7. The organic light-emitting device of claim 6, wherein
   in the first insulating layer, a lateral surface defining the contact hole is inclined relative to the substrate main surface, and
   the gap between the ends of the extension portions in the non-light-emitting unit is located on the lateral surface of the first insulating layer.

8. The organic light-emitting device of claim 2, wherein
   a difference between the height, from the substrate main surface, of the upper surface of the first insulating layer below the light-emitting portions and the height, from the substrate main surface, of the upper surface of the first insulating layer below the gap between the ends of the extension portions in the non-light-emitting portion is equal to or greater than a thickness of portions of the second insulating layer over the extension portions.

9. The organic light-emitting device of claim 1 further comprising
   a non-light-emitting portion between adjacent ones of the light-emitting portions in a third direction that is the other one of the two directions along the main surface of the substrate, in the third direction, the non-light-emitting portion comprising banks each extending in the second direction, wherein
   adjacent ones of the organic laminates in the third direction are partitioned from one another by the banks.

10. An organic display device comprising:
    a display panel; and
    a drive and control circuit unit that is connected to the display panel, wherein
    the display panel has the device structure of the organic light-emitting device of claim 1.

* * * * *